United States Patent [19]

McElroy

[11] 4,219,836
[45] Aug. 26, 1980

[54] CONTACT PROGRAMMABLE DOUBLE LEVEL POLYSILICON MOS READ ONLY MEMORY

[75] Inventor: David J. McElroy, Houston, Tex.

[73] Assignee: Texas Instruments Incorporated, Dallas, Tex.

[21] Appl. No.: 907,235

[22] Filed: May 18, 1978

[51] Int. Cl.² ............................................. H01L 29/02
[52] U.S. Cl. ...................................... 357/55; 357/45; 357/41
[58] Field of Search ............................. 357/45, 41, 55

[56] References Cited

U.S. PATENT DOCUMENTS

| | | | |
|---|---|---|---|
| 3,914,855 | 10/1975 | Cheney et al. | 357/45 |
| 3,985,591 | 10/1976 | Arita | 357/45 |

Primary Examiner—Edward J. Wojciechowicz
Attorney, Agent, or Firm—John G. Graham

[57] ABSTRACT

A contact programmable, small cell area MOS read only memory or ROM is formed by a process compatible with standard N-channel silicon gate manufacturing methods. Address lines are metal, gates are second level polysilicon, and output and ground lines are defined by elongated N+ regions. Each potential MOS transistor in the array is programmed to be a logic "1" or "0", by presence or absence of a contact engaging the polysilicon gate over the thin gate oxide.

10 Claims, 11 Drawing Figures

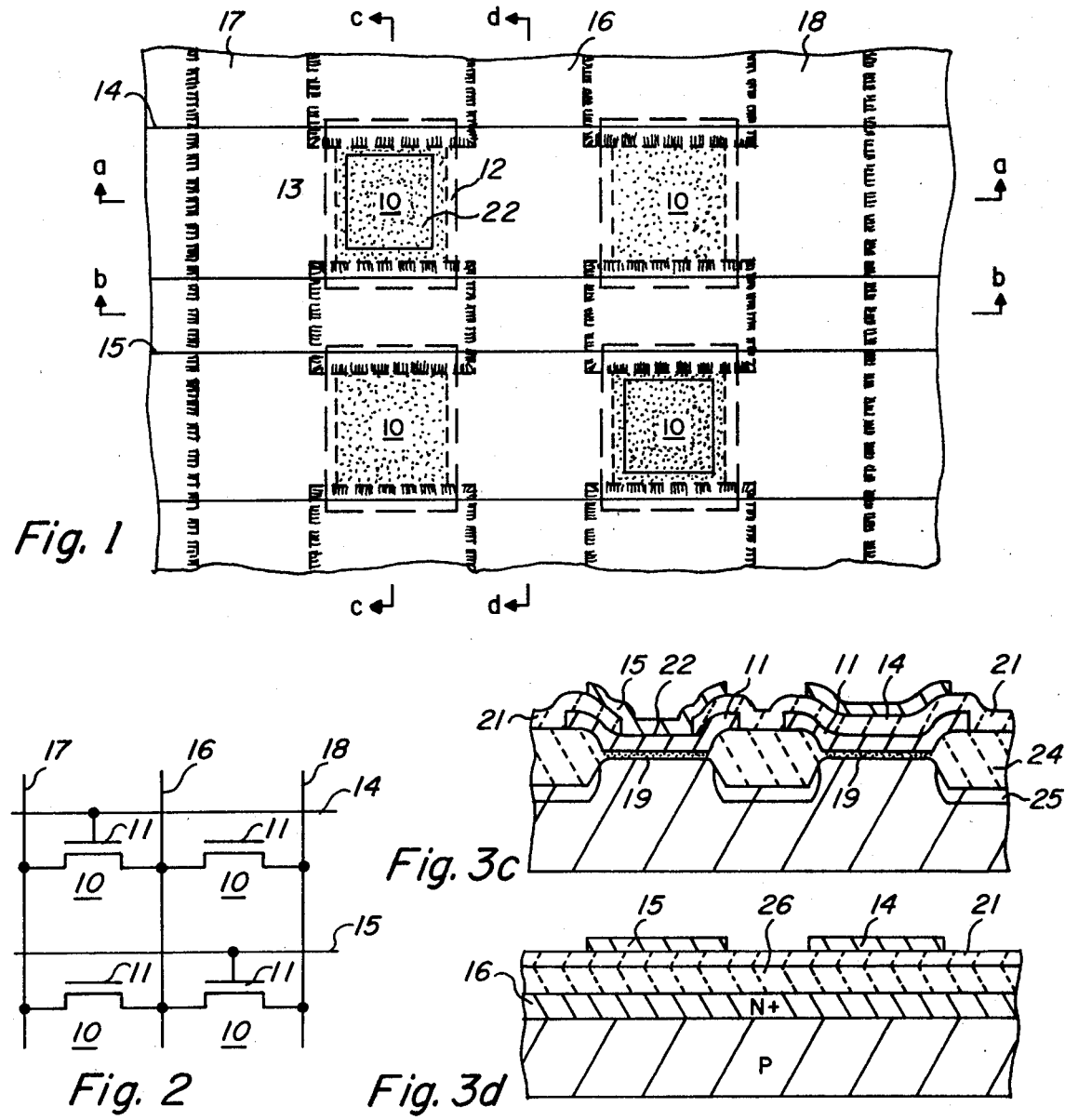

4,219,836

CONTACT PROGRAMMABLE DOUBLE LEVEL POLYSILICON MOS READ ONLY MEMORY

BACKGROUND OF THE INVENTION

This invention relates to semiconductor memory devices, and more particularly to an N-channel silicon gate MOS read only memory and a process for making it.

Storage of fixed programs in digital equipment such as minicomputers and microprocessor systems is usually provided by MOS read only memory devices or "ROMs". The economics of manufacture of semiconductor devices such as ROMs, and of mounting them on circuit boards in the system, are such that the number of memory bits per semiconductor chip is advantageously as high as possible. ROMs of up to 32K bits (32,768) are typical at present. Within a few years, standard sizes will progress through 64K, 128K, 256K and 1 megabit. This dictates that cell size for the storage cells of the ROM be quite small. Metal gate ROMs of small size can be relatively easily fabricated in the manner set forth in U.S. Pat. No. 3,541,543, assigned to Texas Instruments, but usually these are programmed by the gate level mask which is at an early stage in the process. Most microprocessor and computer parts are now made by the N-channel silicon gate process because of the shorter access times provided. In the past, the N-channel process has not been favorable to layout of ROM cells of small size and/or programming has been by the moat mask, also early in the manufacturing process. N-channel ROMs are disclosed in prior applications Ser. Nos. 762,612, filed Jan. 29, 1977 and 701,932, filed July 1, 1976, 890,555, 890,556 and 890,557, filed Mar. 20, 1976, all assigned to Texas Instruments. A series ROM and method of programming is shown in U.S. Pat. No. 4,059,826 to Gerald D. Rogers, assigned to Texas Instruments. Previous cells programmed at the metal level mask were by contact areas between metal lines and polysilicon gates, or by contacts between metal lines and N+ source or drain regions, used excessive space on the chip because a separate area was used for no other purpose than the contact.

It is the principal object of this invention to provide a semiconductor device such as a permanent store memory cell of small size. Another object is to provide a small-area memory cell which is made by a process compatible with standard double level poly N-channel silicon gate manufacturing techniques.

SUMMARY OF THE INVENTION

In accordance with an embodiment of the invention, a semiconductor device such as a metal-oxide-semiconductor read only memory, or MOS ROM, is formed in an integrated circuit along with other silicon gate transistors for the peripheral circuitry. The ROM is an array of potential MOS transistors where metal strips on a silicon bar define the address lines, gates are second level polysilicon beneath the metal, and output and ground lines are defined by elongated N+ regions. In the array, each potential MOS transistor is a storage cell, each cell being programmed as a logic "1" or "0" depending upon whether a contact is made between the metal strip and the polysilicon gate.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

FIG. 1 is a greatly enlarged plan view of a small portion of a semiconductor chip showing the physical layout of a part of a ROM array made according to the invention;

FIG. 2 is an electrical schematic diagram of the ROM of FIG. 1;

FIGS. 3a-3b are elevation views in section of the cell of FIG. 1, taken along the lines a—a, b—b, c—c, and d—d, respectively.

DETAILED DESCRIPTION OF SPECIFIC EMBODIMENTS

Figure 3B:
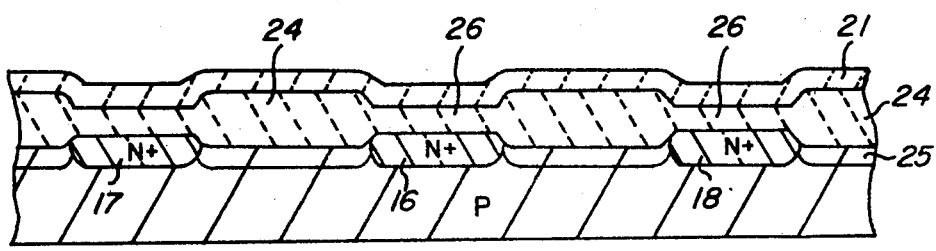

With reference to FIGS. 1, 2, and 3a-3d, a read only memory is illustrated which uses the contact programmable feature according to the invention. The array consists of a large number of cells 10, only four of which are shown. Each cell is an MOS transistor having a gate 11, a source 12 and a drain 13. The gates 11 are parts of the second level polysilicon, and metal strips 14 and 15 are the X address lines for the array. The sources are part of an N+ diffused region 16 which is connected to ground or Vss, while the drains are part of N+ diffused regions 17 and 18 which are Y output lines. The array, formed on a silicon bar 20, would typically contain perhaps 64K, 128K or 256K cells, and the bar would be less than about 200 mils on a side or 40,000 sq. mil area depending upon the bit density. The four cells 10 shown would be on a minute part of the bar, perhaps one or two mils wide. A 64K ROM would require 256 of the X address lines such as 14 and 15 and 256 of the Y lines like the lines 16 and 18, providing 65,536 bits. Although a Vss or ground line is shown, it is preferable that the array is of a virtual ground type such as disclosed in U.S. Pat. No. 3,934,233, issued to Roger J. Fisher and Gerald D. Rogers or U.S. Pat. No. 4,021,781 issued to Edward R. Caudel both assigned to Texas Instruments, in which case one Vss line for each eight or sixteen Y lines would be all that would be needed, or alternatively, the array is of a virtual ground type wherein no dedicated ground lines are used, but instead one Y line adjacent a selected cell is selected as ground, dependin upon the Y address. The Y line on the other side of the selected cell is the Y output line, all this being defined by the Y decoder.

The cell array is programmed by contacts between the metal strips 14 and 15 and the gates 11. Where a contact exists, the transistor 10 will be turned on by the voltage on the selected address line 14, 15, etc. In the example of four complete cells shown, the upper right cell and the lower left cell have contacts in this manner, the others not. A thick multilevel oxide layer 21 is used as the insulator, with apertures 22 etched in the layer 21 above the cells 10 which are to be contacted. The layer 21 is non-thermal oxide deposited at low temperature in accord with standard MOS manufacturing methods. Usually this oxide covers everything except the metal to poly or metal to silicon contacts.

A thick field oxide coating 24 covers parts of the bar not occupied by the transistors or diffused interconnects, and P+ channel stop regions 25 are formed underneath all the thick field oxide. A thinner field oxide coating 26 covers the N+ diffused regions 16, 17, 18.

Turning now to FIGS. 4a–4e, a process for making the ROM array of the invention will be described. The right hand side of these FIGURES corresponds to the section view of FIG. 3a, while the left hand side shows the formation of an N-channel silicon gate transistor of conventional form on the periphery of the chip, i.e., not in the cell array. The starting material is a slice of P-type monocrystalline silicon, typically 3 inches in diameter and twenty mils thick, cut on the -100- plane, of a resistivity of about 6 to 8 ohm-cm. As above, in the FIGURES the portion shown of the bar 20 represents only a very small part of the slice, perhaps less than about one mil wide for each part. After appropriate cleaning, the slice is oxidized by exposing to oxygen in a furnace at an elevated temperature of perhaps 1100 degrees C. to produce an oxide layer 31 over the entire slice of a thickness of about 1000 Angstroms. Parts of this layer 31 may stay in place to become the gate insulator areas 19, but usually the layer is later removed and new gate oxide grown. Next, a layer 32 of silicon nitride of about 1000 Angstroms thickness is formed over the entire slice by exposing to an atmosphere of dichlorosilane and ammonia in a CVD reactor. A coating of photoresist is applied to the entire top surface of the slice, then exposed to ultraviolet light through a mask which defines the desired pattern of the thick field oxide 24 and the P+ channel stop 25. The resist is developed, leaving areas where nitride is then etched away by a nitride etchant, removing the exposed part of the nitride layer 32 but leaving in place the oxide layer 31; the nitride etchant does not react with the photoresist.

Using photoresist and nitride as a mask, the slice is now subjected to an ion implant step to produce the channel stop regions 25, whereby boron atoms are introduced into unmasked regions 33 of silicon. The oxide layer 31 is left in place during the implant because it prevents the implanted boron atoms from out-diffusing from the surface during subsequent heat treatment. This implant is at a dosage of about $10^{13}$ per sq. cm at 150 KeV. The regions 33 do not exist in the same form in the finished device, because some of this part of the slice will have been consumed in the field oxidation procedure. Usually the slice would be subjected to a heat treatment after implant but prior to field oxide growth, as set forth in U.S. Pat. No. 4,055,444, assigned to Texas Instruments.

Figure 4A:
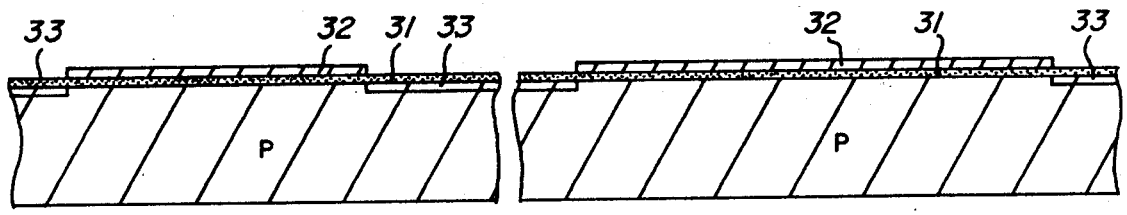
FIGS. 4a-4e are elevation views in section of the ROM array and a transistor in the peripheral part of the semiconductor device of FIGS. 1 and 3a-3d, at successive stages in the manufacturing process, taken generally along the line a—a in FIG. 1.
Figure 4B:
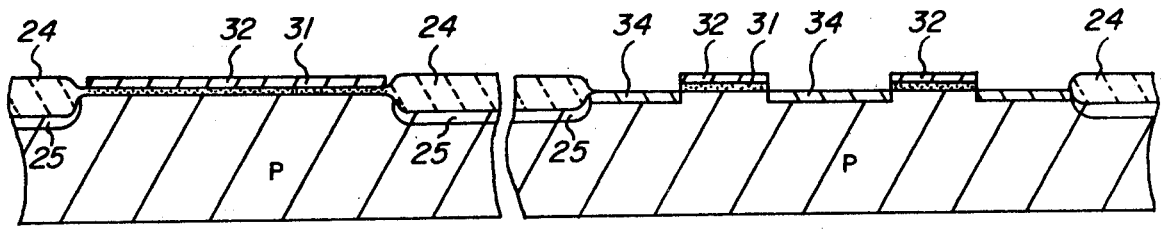

The next step in the process is formation of field oxide 24, which is done by subjecting the slices to steam or an oxidizing atmosphere at about 900 degrees C. for perhaps five hours. This causes a thick field oxide region or layer 24 to be grown as seen in FIG. 4b. This region extends into the silicon surface because silicon is consumed as it oxidizes. The remaining parts of the nitride layer 32 mask oxidation. The thickness of this layer 24 is about 6000 Angstroms, about half of which is above the original surface and half below. The boron doped P+ regions 33 formed by implant will be partly consumed, but will also diffuse further into the silicon ahead of the oxidation front. Thus, P+ field stop regions 25 will result which will be much deeper than the orignial regions 33. At this point, the field oxide layer 24 is not nearly as thick as it will be in the finished device. Additional thickness results from subsequent heat treatments.

The slice is now coated with another photoresist layer and then exposed to ultraviolet light through a mask which defines the source and drain areas 12 and 13 as well as the lines 16, 17 and 18 which are to be N+ diffused. After developing the slice is again subjected to a nitride etchant which removes the parts of the nitride layer 32 now exposed by holes in the photoresist. The parts of the oxide layer 31 left bare when this nitride is removed are then etched to expose the silicon surface. A phosphorus diffusion produces the N+ regions 34 which will subsequently become the sources, drains, etc. Instead of diffusion, these N+ regions 34 may be formed by ion implant, in which case the oxide layer 31 would be left in place and an anneal step used before the subsequent oxidation.

Figure 4C:
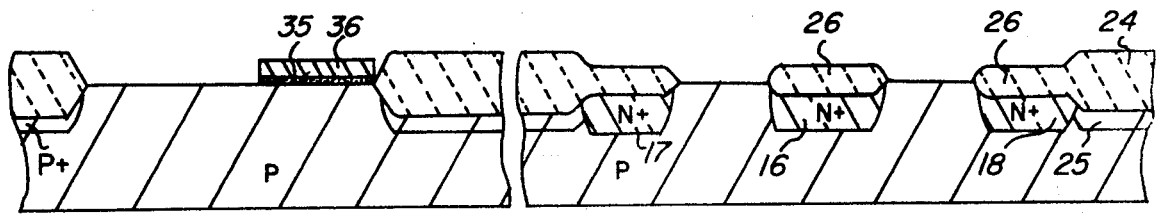

Referring to FIG. 4c, a second field oxidation step is now performed by placing the slice in steam or dry oxygen at about 1000 degrees C. for several hours. This oxidizes all of the top of the slice not covered by the remaining parts of the nitride layer 32, producing field oxide 26 which is about 5000 Angstroms thickness. During this oxidation, the areas of field oxide 24 grow thicker, to perhaps 10,000 Angstroms. The N+ regions 34 are partly consumed but also diffuse further into the silicon ahead of the oxidation front to create the heavily doped regions 12, 13, 16, 17 and 18.

Next the remaining nitride layer 32 is removed by an etchant which attacks nitride but not silicon oxide, then the oxide 31 is removed by etching and the exposed silicon cleaned. The gate oxide 39 is grown by thermal oxidation to a thickness of about 800 Angstroms. In areas of the slice where depletion load devices are required, although not pertinent to this invention, a masked ion implant step would be done at this point. Likewise, the threshold voltage of the enhancement mode transistors in the ROM array or periphery may be adjusted by ion implant. Also, windows for first polysilicon to silicon contacts, if needed, are patterned and etched at this point using photoresist; none are needed in the ROM array itself or the peripheral transistor shown.

Figure 4D:
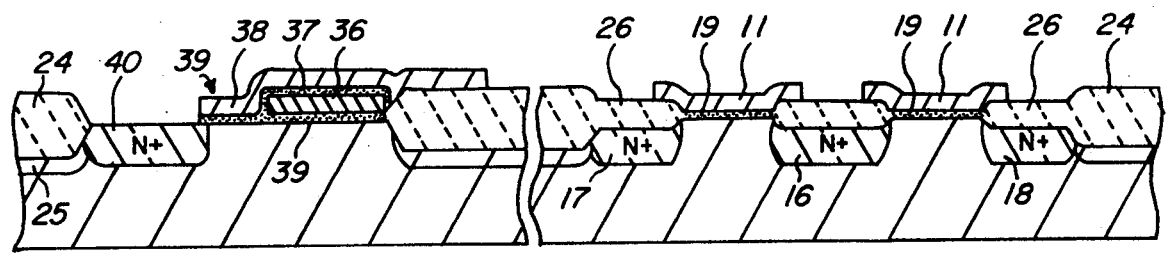
Figure 4E:
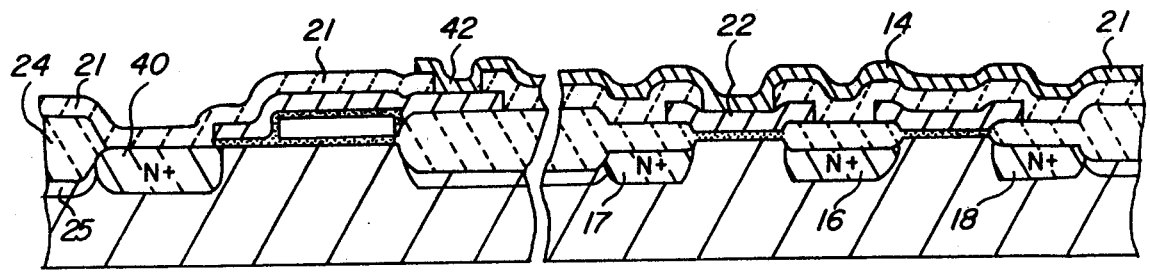

As seen in FIG. 4d a first layer of polycrystalline silicon is deposited over the entire slice in a reactor using standard techniques at a thickness of about 5000 Angstroms. This poly layer is doped with phosphorus by an N+ diffusion to make it highly conductive, then it is patterned by applying a layer of photoresist, exposing to ultraviolet light through a mask prepared for this purpose, developing, then etching both photoresist and exposed oxide. The remaining photoresist masks certain areas of the polysilicon to define various elements in the peripheral circuitry, such as a capacitor plate 36. The unmasked first level polycrystalline silicon is etched away, so the resulting structure is seen in FIG. 4e.

A thin thermal oxide coating 37 is first applied to the first level poly as seen in FIG. 4d by exposing the slice to steam or an oxygen atmosphere at about 900 degrees C. for about one-half hour to produce a coating of about 800 Angstroms. This coating acts as an insulator where the first and second level poly overlaps, and also acts as an etch barrier when patterning the second level. Further, this thermal oxide is grown over bare silicon in the positions of the ROM array transistors 10 to function as the gate oxide 19, as well as the gate oxide of a transistor adjacent the capacitor plate 36. The second poly is deposited by standard techniques to produce a layer of about 5000 Angstroms covering the entire slice. It is then patterned by photoresist to define the gate areas 11 in the ROM array, as well as the gate 38 of the transistor 39 and other transistors and interconnections in the peripheral circuitry. Then, the thin thermal oxide 37 is removed over the peripheral transistor 39 to define the gate, using the second level poly as an etch mask so self-alignment is provided. Now the slice is subjected to a standard N+ diffusion operation to produce the N+ source or drain region 40 for the transistor 39, as well as other peripheral transistors. At the same time, the second level poly including the gates 11 and 38 is heavily doped to render it conductive.

A thick layer 21 of silicon oxide is deposited by decomposition of silane at a low temperature, about 400 degrees C. This layer 41 insulates the metal level from the polycrystalline silicon level of interconnections, and is referred to as multilevel oxide. The multilevel oxide layer is now patterned by a photoresist operation, exposing the selected gates 11 in the ROM array area, as well as a contact area 42 for a metal-to-polysilicon contact and contact areas for a metal-to-silicon contacts (not shown). Metal contacts and interconnections are used in the periphery of the chip in the input buffers, decoders, sense amplifiers, substrate pump, and the like, as well as for the bonding pads which provide connection to external electrodes. The metal contacts and interconnections are made in the usual manner by depositing a thin film of aluminum over the entire top surface of the slice then patterning it by a photoresist mask and etch sequence. This leaves a metal strip 43 connecting the gate 38 of N-channel silicon gate transistor 39 to the contact area 42 and of course the polysilicon X address lines 14, 15, etc.

Up to the point in the process of patterning the multilevel oxide 21, all slices are exactly the same as no programming has been done in the ROM array. The slices are processed routinely to that stage with no requirement for separate inventory controls and separate identification of each lot. An inventory of slices finished up through multilevel oxide patterning may be maintained for quick response to custom orders for ROM codes. Then, the ROM array is programmed by patterning the layer 21 by a photoresist mask and etch sequence using a unique mask which defines the ROM code. An aperture 22 is defined over each cell 10 to be programmed as a "0", and each cell 10 to be a "1" is left covered. It is important that the mask alignment for creating the apertures 22 in the oxide 21 by the programming mask is non-critical. The active channel area of the transistors 10 has already been defined in previous processing step with thin gate oxide 19. No catastrophic failure results if the apertures 22 miss the edge of the second level poly gates 11, so long as the metal touches the gates.

In operation, the X address selects one of the lines 14 or 15, or one of the other of the 256 such lines in a 64K ROM, and this selected line is held at logic 1 level or about +5 V. The remaining lines are held at Vss, logic 0. The Y address selects one of the 256 lines such as 16 or 18, and this line is connected via the Y decoder to the output, while the adjacent line 17 is connected to Vss.

While this invention has been described with reference to illustrative embodiments, this description is not intended to be construed in a limiting sense. Various modifications of the illustrative embodiments, as well as other embodiments of the invention, will be apparent to persons skilled in the art upon reference to this description. It is, therefore contemplated that the appended claims will cover any such modifications or embodiments as fall within the true scope of the invention.

what is claimed is:

1. A read only memory device comprising an array of rows and columns of field effect transistors at a face of a semiconductor body, each transistor providing a memory cell and having a source-to-drain path and a gate with thin gate insulator between the gate of every transistor and its underlying source-to-drain path, a plurality of generally parallel column lines formed by elongated heavily-doped regions in the face creating the ends of the source-to-drain paths, a plurality of generally parallel row lines normal to the column lines formed by elongated conductive strips each overlying the gates of a plurality of the transistors in a row but not forming such gates, and programming apertures formed in an insulting layer between the conductive strips and the face to make electrical contact between the strips and selected ones of the gates but not all of said gates, the apertures directly overlying the gates and source-to-drain paths, the selected ones of the gates to which electrical contact is made functioning as gates of active transistors and the remaining gates not contacted being nonfunctional.

2. A device according to claim 1 wherein the gates are polycrystalline silicon and the conductive strips are metal.

3. A device according to claim 2 wherein a plurality of N-channel silicon gate transistors are formed in said face peripheral to the array.

4. A device according to claim 3 wherein gates of said silicon gate transistors peripheral to the array are formed of a first level of polycrystalline silicon and the gate of the transistors in the array are formed of a second level of polycrystalline silicon.

5. A device according to claim 4 wherein a thick coating of thermal oxide overlies the elongated heavily-doped regions.

6. A semiconductor device comprising a plurality of field effect transistors at a face of a semiconductor body, each transistor having a source-to-drain path and a gate with a thin gate insulator between the gate of each transistor and its underlying source-to-drain path, elongated heavily-doped regions in the face creating the ends of the source-to-drain paths and electrical connections to the transistors, at least one elongated conductive strip overlying the gates of a plurality of the transistors but not forming such gates, and a plurality of programming apertures formed in an insulating layer between the conductive strip and the face to make electrical contact between the strip and selected ones of the gates but not all of the gates, the apertures directly overlying the gates and source-to-drain paths.

7. A device according to claim 6 wherein the gates are polycrystalline silicon and each conductive strip is metal.

8. A device according to claim 7 wherein a plurality of N-channel silicon gate transistors are formed in said face peripheral to said field effect transistors.

9. A device according to claim 8 wherein gates of said silicon gate transistors peripheral to said field effect transistors are formed of a first level of polycrystalline silicon and said gates of said field effect transistors are formed of a second level of polycrystalline silicon.

10. A device according to claim 9 wherein a thick coating of thermal oxide overlies the elongated heavily-doped regions and edges of said gates overlie the thick coating.

* * * * *